United States Patent [19]
Tsui

[11] Patent Number: 5,891,799
[45] Date of Patent: Apr. 6, 1999

[54] METHOD FOR MAKING STACKED AND BORDERLESS VIA STRUCTURES FOR MULTILEVEL METAL INTERCONNECTIONS ON SEMICONDUCTOR SUBSTRATES

[75] Inventor: Bing-Yue Tsui, Hsinchu, Taiwan

[73] Assignee: Industrial Technology Research Institute, Hsin-Chu, Taiwan

[21] Appl. No.: 912,326

[22] Filed: Aug. 18, 1997

[51] Int. Cl.⁶ .......................... H01L 21/28; H01L 21/304
[52] U.S. Cl. .......................... 438/624; 438/633; 438/634; 438/637
[58] Field of Search ..................... 438/618, 620, 438/622, 623, 624, 625, 626, 631, 633, 634, 637

[56] References Cited

U.S. PATENT DOCUMENTS

| | | | |
|---|---|---|---|
| 4,832,789 | 5/1989 | Cochran et al. | 438/624 |
| 4,944,682 | 7/1990 | Cronin et al. | 437/192 |
| 5,189,506 | 2/1993 | Cronin et al. | 438/618 |
| 5,222,329 | 6/1993 | Yu | 51/165.77 |
| 5,350,712 | 9/1994 | Shibata | 437/195 |
| 5,466,636 | 11/1995 | Cronin et al. | 437/187 |
| 5,576,243 | 11/1996 | Wuu et al. | 437/195 |
| 5,612,254 | 3/1997 | Mu et al. | 438/622 |
| 5,726,099 | 3/1998 | Jaso | 438/693 |

*Primary Examiner*—T. N. Quach
*Attorney, Agent, or Firm*—George O. Saile; Stephen B. Ackerman

[57] ABSTRACT

A method for making stacked and borderless via structures on multilevel metal interconnections for integrated circuits was achieved. The method involves forming a planar Inter-Layer Dielectric (ILD) silicon oxide ($SiO_2$) layer and a silicon nitride ($Si_3N_4$) hard mask layer over a patterned first electrically conducting layer. A patterned first photoresist etch mask is then used to etch trenches in the hard mask film and partially into the ILD layer ($SiO_2$). A second photoresist etch mask having openings extending over the trenches is used to etch vias (or contact holes) in the remaining ILD layer to the patterned first conducting layer using the hard mask to form borderless (self-aligned) vias. The high etch-rate ratio (selectivity) of the $SiO_2$ to the $Si_3N_4$ (>20:1) results in only shallow recesses in the $Si_3N_4$ masking layer. A second conductive layer is deposited and chemically-mechanically polished back to the hard mask layer and overpolished to remove a shallow recess in the hard mask and metal therein. This results in coplanar borderless via structures in the ILD with improved design ground rules. The process can be repeated several times to complete the multilevel metal interconnections needed to wire-up the integrated circuit. The coplanar structure also results in excellent stacked via structures.

19 Claims, 6 Drawing Sheets

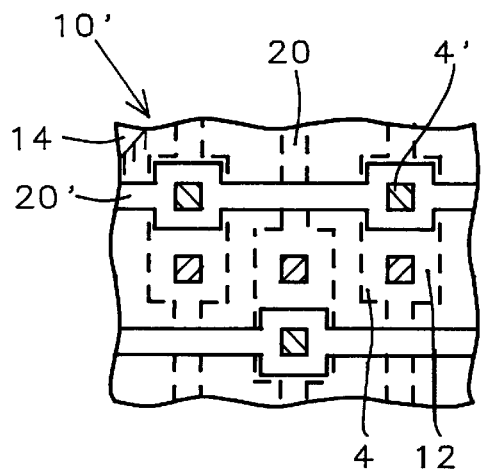
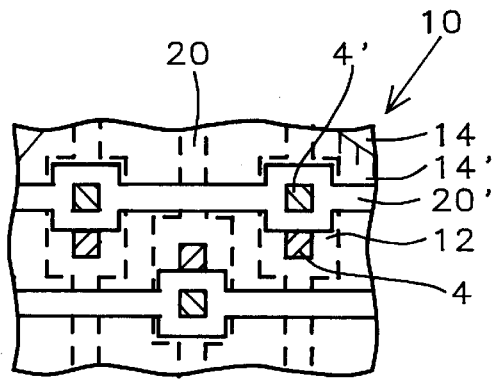
FIG. 1A – Prior Art
FIG. 1B – Prior Art
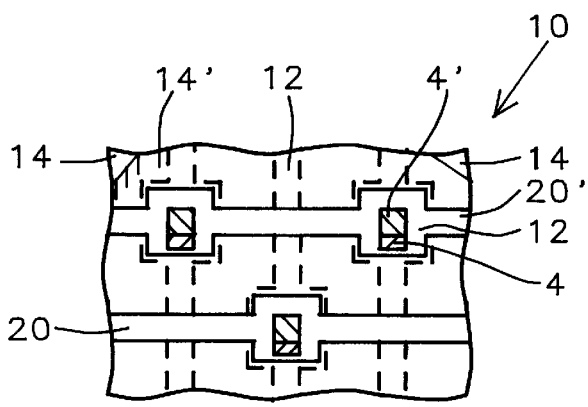
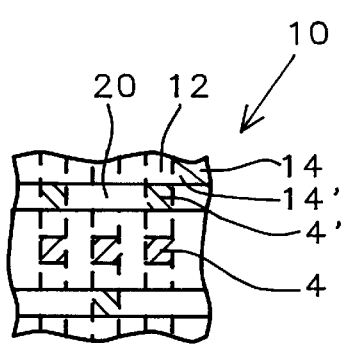
FIG. 1C – Prior Art
FIG. 1D – Prior Art
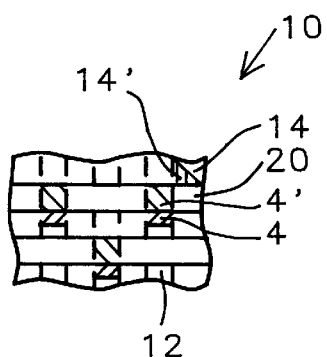
FIG. 1E – Prior Art

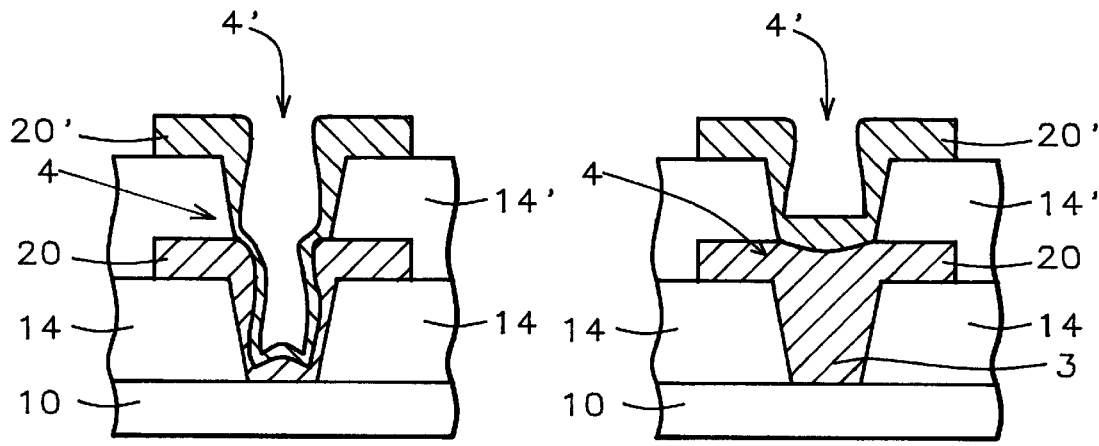
FIG. 2A – Prior Art
FIG. 2B – Prior Art
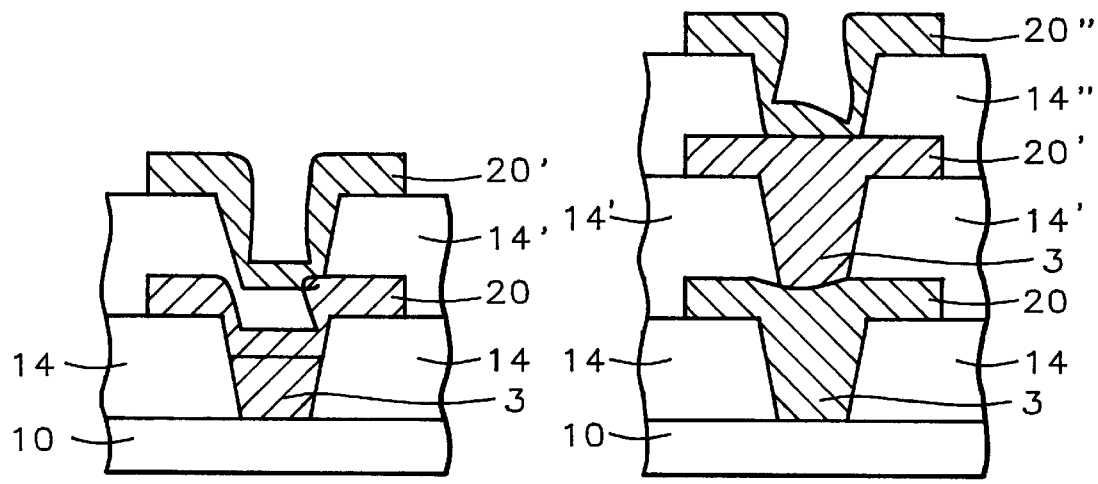
FIG. 2C – Prior Art
FIG. 2D – Prior Art

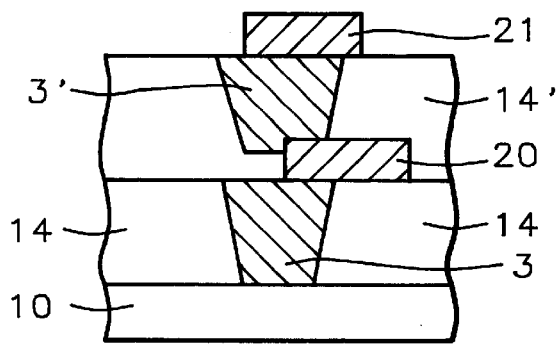
FIG. 3 - Prior Art
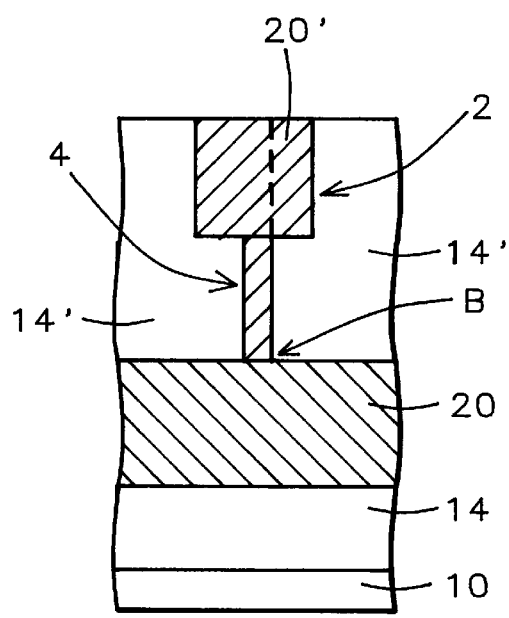
FIG. 5 - Prior Art
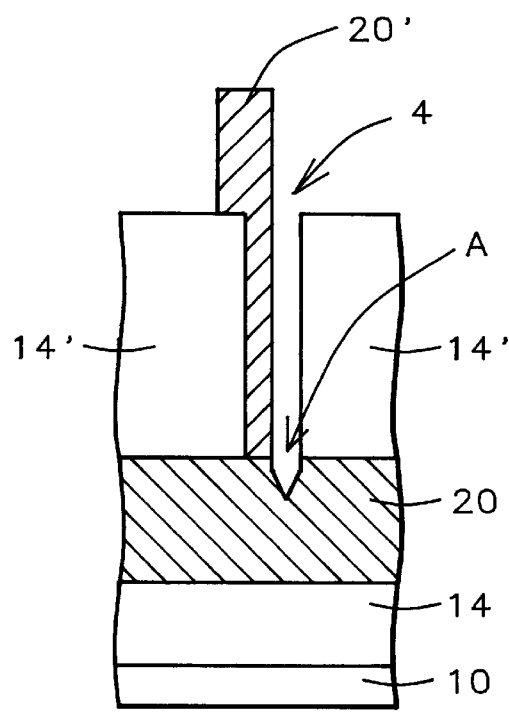
FIG. 4 - Prior Art

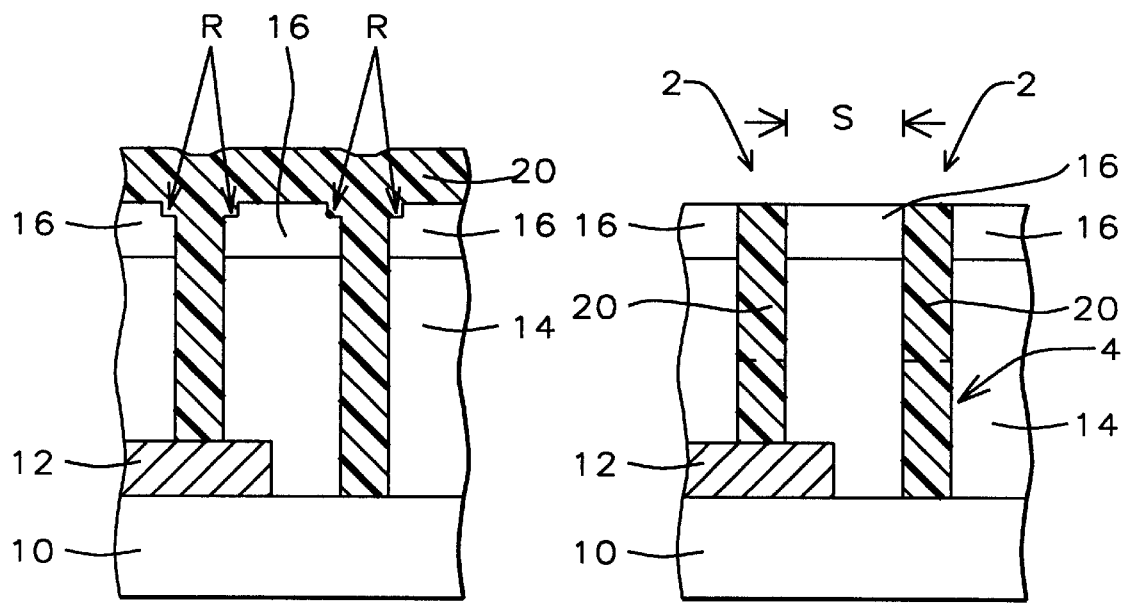
FIG. 9
FIG. 10
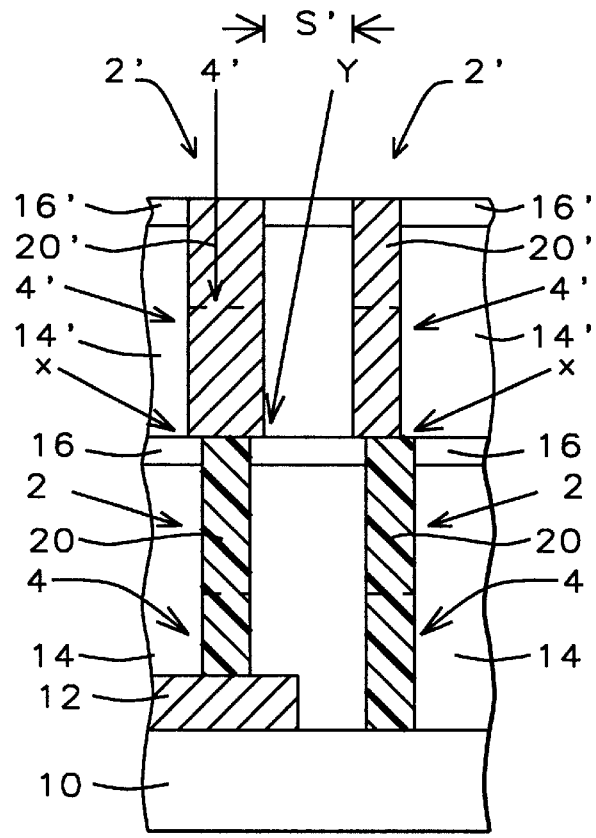
FIG. 11

METHOD FOR MAKING STACKED AND BORDERLESS VIA STRUCTURES FOR MULTILEVEL METAL INTERCONNECTIONS ON SEMICONDUCTOR SUBSTRATES

BACKGROUND OF THE INVENTION

(1) FIELD OF THE INVENTION

The present invention relates to ultra large scale integrated (ULSI) circuits on semiconductor substrates, and more particularly relates to a method for forming reliable stacked and borderless via structures for multilevel metal interconnections.

(2) DESCRIPTION OF THE PRIOR ART

The integrated circuits formed on semiconductor substrates for Ultra Large Scale Integration (ULSI) require multilevels of metal interconnections for electrically interconnecting the discrete semiconductor devices on the semiconductor chips. A dielectric layer, usually referred to as the Poly/Metal 1 Dielectric (PMD), is deposited over the field effect transistor (FET) polysilicon gate electrodes and substrate contacts to electrically insulate the devices from the next patterned metal layer. The different levels of metal interconnections are then separated by layers of insulating material, commonly referred to as Interlevel Metal Dielectric (IMD) layers. Both the PMD and IMD layers are commonly referred to as the InterLevel Dielectric (ILD) layers. These interposed dielectric (or insulating) layers have etched contact holes in the PMD layer to the underlying semiconductor devices or vias (holes) in the IMD layers which are used to electrically connect one level of metal to the next level of metal, and hereafter simply referred to as vias.

As the ULSI technology is scaled down to smaller dimensions, one of the most difficult obstacles to continued downscaling is controlling the level-to-level alignment of the photolithography. This is especially a problem in the complex structure of the interconnecting metal and vias as minimum device feature sizes reach 0.18 micrometers. Consequently, the packing density of the metal lines becomes limited by design ground rules governing the separation of the contact holes and/or vias from another level, that is by design rules that limit the nesting (stacking) of contact holes or vias in the ILD layer between the patterned conducting layers.

To better appreciate the advantages of using stacked and borderless contact holes and via structures, a sequence of schematic top views for the design layout of two levels of patterned metal and interconnecting vias is shown by the prior art in FIGS. 1A–1D for different design ground rules. In all FIGS. an insulating InterLayer Dielectric (ILD) 14 is deposited and contact holes or vias 4 are etched in the ILD 14 to the substrate 10, or to a patterned conducting layer (not shown) on the substrate. A patterned first metal layer 20 is formed on the ILD layer 14 over the vias 4, and a second ILD layer 14' is deposited to insulate the patterned metal layer 20. Vias 4' are etched in ILD 14' to metal layer 20 and a second metal layer 20' is patterned to form the second level of metal interconnections. The metal lines in FIG. 1A have borders (wider metal lines 20 and 20') to accommodate misalignment of the vias 4 and 4', and also the vias are not stacked (one over the other), and therefore require the larger design layout area. The metal lines in FIG. 1B do not require design rule separation between metal lines on different levels for via holes 4 and 4', and require less area. FIG. 1C shows stacked vias and metal-to-metal separation design rules, FIG. 1D shows borderless vias without via stacking, and FIG. 1E shows stacked and borderless via structures. It is clearly seen from FIG. 1E that the stacked and borderless via structures provide a space-saving advantage, which is about a 62% reduction in area. Therefore, it is very desirable to form stacked and borderless via structures that reduce the total area occupied by the metal inter-connections by about 62%. This results in an increased device packing density on the integrated circuit chip.

Unfortunately, several processing problems arise when stacked and borderless via structures are fabricated. These process problems are best illustrated by referring to the schematic cross-sectional views of a two-level metal having vias in the prior art FIGS. 2A–2D, FIGS. 3A–3C, and FIGS. 4 and 5.

FIGS. 2A–2D depict the problems with making stacked vias. In FIG. 2A no metal plug is used in the vias 4 and can result in poor electrical contacts causing current crowding and electromigration of metal atoms, while a good metal plug 3, as in FIG. 2B, ensures good via contacts. A poorly formed metal plug 3, as in FIG. 2C, can also result in poor via contacts. FIG. 2D shows a three-level metal structure with good metal plugs 3 and good via contacts, but unfortunately requires design rules for metal borders to prevent misalignment, as depicted in FIG. 3, when borderless vias are used. Making borderless via structures by the conventional method (by opening via, depositing metal, and patterning metal), as depicted in FIG. 4, can result in damage to the underlying metal 20 at location A when the upper metal 20' etch mask is misaligned over the via 4 in the ILD layer 14' during patterning of layer 20' and also reduces the contact area of metal 20' to metal 20 at location A in the via 4.

In the conventional Dual Damascene process, as shown in FIG. 5, a trench 2 is partially etched in the ILD layer 14' and the via 4 is etched to the underlying metal 20. The trench 2 and via 4 are filled with metal 20' and etched or polished back by chemical/mechanical polishing (CMP) to the surface of layer 14'. However, when the via 4 etching is misaligned to the trench 2, as would occur in borderless vias, then contact area B is very small resulting in high contact resistance. For example, in the 0.18 um technology, the metal line widths are about 0.2 um and a misalignment of 0.1 um would result only in a 0.1 um wide contact.

There is still a strong need in the semiconductor industry for providing a simplified method for forming self-aligned stacked and borderless via structures between the patterned metal levels which are not limited by the design rules.

SUMMARY OF THE INVENTION

It is a principal object of the present invention to provide an improved method for forming stacked and borderless via structures between multilevel metal interconnections.

It is another object of this invention to provide these stacked/borderless via structures using a patterned hard mask material composed of silicon nitride having a very low etch rate (less than 1:20) to the underlying intermetal dielectric (ILD) and Poly/Metal 1 Dielectric (PMD) layer.

It is another object to provide a relatively planar metal/ILD surface structure that allows for making stacked via structures.

In summary, these objectives are achieved by this invention which forms stacked and borderless via structures for multilevel interconnections on a substrate. More specifically, the method uses a hard mask composed of silicon nitride ($Si_3N_4$) over the interlevel dielectric to form vias self-aligned to trenches. The metal lines and metal plugs are then formed by depositing and chemical/ mechanically polishing back the metal layer using a modified Damascene process, which includes an overpolish. The overpolish eliminates residual metal trapped in shallow recesses in the hard mask that are a consequence of etching the self-aligned via holes for borderless vias structures. The intermetal dielectric layer is composed of a plasma-enhanced chemical vapor deposited (PECVD) silicon oxide.

The invention begins by providing a semiconductor substrate. The most commonly used substrate in the semiconductor industry is composed of single crystal silicon. However, the method is also applicable to other types of substrates where electrical interconnections are desirable. Typically the semiconductor substrate contains electrically isolated device areas in which the semiconductor devices are formed, such as field effect transistors (FETs), bipolar transistors, and the like. Typically the semiconductor devices are made in part from a patterned first conducting layer such as a conductively doped polysilicon, although metal silicides and metals can also be used.

An insulating layer, commonly referred to as the Inter-Layer Dielectric (ILD), and more specifically as the Polysilicon/Metal Dielectric (PMD) layer is deposited on the substrate to electrically insulate the devices. The ILD or PMD layer, composed of a low-pressure chemical vapor deposited (LPCVD) silicon oxide ($SiO_2$), is deposited over the patterned first conducting layer. If a low-melting-temperature conducting layer, such as aluminum, is used then the ILD layer is deposited at lower temperatures using plasma-enhanced chemical vapor deposition (PECVD). The ILD layer is then planarized, for example, using chemical/mechanical polishing. A hard mask layer composed of silicon nitride ($Si_3N_4$) is deposited on the interlevel dielectric (ILD) layer. Conventional photolithographic techniques using a patterned first photoresist layer and a first anisotropic plasma etching are then used to pattern the hard mask layer and to partially etch into the interlevel dielectric (ILD) layer to form trenches in which a patterned second conducting layer, such as aluminum (Al) or aluminum-copper (Al-Cu) alloy will be formed. Typically a barrier layer, such as titanium (Ti) and/or titanium nitride (TiN) is deposited first to prevent reaction of Al with the shallow diffused junctions in the silicon substrate. A second photoresist mask is then formed having openings wider than, and extending over portions of the trenches where the vias (contact holes) are required. This ensures that the vias are self-aligned to the trenches, and therefore the alignment ground rule can be relaxed. A second anisotropic plasma etch is used to etch the remaining IMD layer in the photoresist openings to the patterned first conducting layer to form the vias, while the hard mask serves as an etch-stop masking layer. In current technology the etching selectivity between ILD and the $Si_3N_4$ is greater than 20:1, and therefore provides an excellent etch-stop mask material. For example, if the ILD layer is 1.0 micrometers (um) thick, then the vias can be etched with a 50% overetch to ensure that all vias are etched open. This results in only a 25- to 50-nanometer (0.025–0.050 um) recess in the $Si_3N_4$ hard mask layer because of the high etch selectivity between the ILD layer and the $Si_3N_4$. This results in forming vias (holes) in the ILD layer which are self-aligned to the trenches, and thereby providing borderless vias. A conformal second conducting layer, such as Al or Al/Cu alloy, is deposited to fill the vias and the trenches. A modified chemical/mechanical polishing is used in which the second conducting layer is polished back to the IMD or ILD layer, and important to the method of this invention, an overpolish is carried out to remove the slight recesses (about 25–50 nm) in the $Si_3N_4$ hard mask and the metal that lies therein. This results in a borderless (self-aligned) via structure for the metal lines which are coplanar with the top surface of the ILD layer. The process steps can be repeated for each additional level of metal interconnections as required to complete the wiring-up of the integrated circuits, and because of the planarity, the invention allows for the stacking of vias to further reduce the integrated circuit area.

BRIEF DESCRIPTION OF THE DRAWINGS

The objects and other advantages of this invention are best understood with reference to the preferred embodiment when read in conjunction with the following drawings.

FIGS. 1A through 1E show prior-art schematic top views depicting the advantages of stacked and borderless via structures over via structures having various degrees of borders and stacked vias.

FIGS. 2A through 2D show prior-art schematic cross-sectional views of via structures showing the problems associated with making stacked vias having borders.

FIG. 3 shows a prior-art schematic cross-sectional view depicting the problems of making stacked and borderless via structures.

FIG. 4 shows a prior-art schematic cross-sectional view of the problem of misalignment in making borderless vias by conventional etch processes.

FIG. 5 shows a prior-art schematic cross-sectional view of the problem of misalignment in making borderless vias by using the Dual-Damascene process.

FIGS. 6, 7A, 8A, 9, 10, AND 11 show schematic cross-sectional views for making the improved stacked and borderless via structures of this invention, while FIGS. 7B and 8B respectively show top views of the trenches etched in the ILD for the metal lines, and a second photoresist mask layout for etching the via or contact hole structures.

DESCRIPTION OF THE PREFERRED EMBODIMENT

Figure 6:
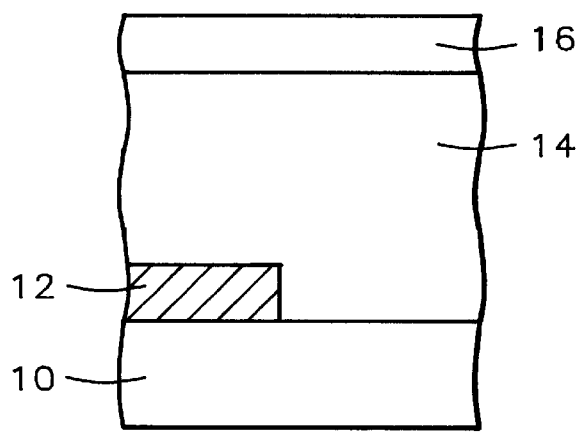

The method of the present invention is now described in detail for making improved stacked and borderless via structures in an interlevel dielectric (ILD). The method is identical for making stacked and borderless contacts in both the Polysilicon/Metal Dielectric (PMD) layer to the underlying patterned polysilicon layer and to the substrate, and also for making vias in the intermetal dielectric (IMD) layer between metal layers. Therefore to simplify the discussion, hereafter both will be referred to simply as vias and ILD layers. Although the method is described for only two levels of metal wiring (or between patterned polysilicon layers/substrate and metal lines), it should be well understood by those skilled in the art that the method can be repeated to form additional levels of metal wiring in which stacked vias can be made that further reduce the substrate area on which the integrated circuit is made. Although the metal lines formed are from Al or Al/Cu, it is common practice in the industry to provide a barrier layer such as Ti and/or Ti/TiN. However, these layers are not shown in the drawings to simplify the drawings and discussion. The barrier layer prevents Al penetration into the silicon substrate and/or Al electromigration between metal lines. The barrier layer can also serve as an antireflective coating (ARC).

Referring now to FIG. 6, a semiconductor substrate 10 is provided on and in which are formed the semiconductor devices, such as FETs and bipolar transistors, but are not depicted to simplify the drawings and discussion. The most commonly used substrate in the semiconductor industry is composed of single crystal silicon. However, the method is also applicable to other types of substrates where electrical interconnections are desirable. Typically the semiconductor devices are made in part from a patterned first conducting layer 12 such as a conductively doped poly-silicon, although metal silicides and metals can also be used. For example, the patterned layer 12 can form the gate electrodes for FETs, local interconnections, or polysilicon emitter, base, and collector contacts on bipolar devices, and the like. The polysilicon layer is typically $N^+$ doped with arsenic (As) or phosphorous (P), or $P^+$ doped with boron (B), and can be doped by ion implantation, or in-situ doped during the polysilicon deposition using LPCVD and a reactant gas such as silane ($SiH_4$). The first conducting layer 12 is preferably deposited to a thickness of between about 2000 and 8000 Angstroms and is patterned by conventional photolithographic techniques and anisotropic plasma etching.

Next, as shown in FIG. 6, an insulating layer 14, commonly referred to as the InterLayer Dielectric (ILD), is deposited on the substrate to electrically insulate the patterned first conducting layer 12 from the next level of metal interconnections (metal lines). ILD layer 14 is preferably a silicon oxide ($SiO_2$), or can be a doped silicon oxide (glass) such as a phosphorus glass (PSG) or a boron/phosphorus doped glass (BPSG). Layer 14 is deposited by LPCVD using, for example, tetraethosiloxane (TEOS) and ozone (O3). However, if patterned layer 12 is a low-melting-point metal, or if the thermal budget (temperature×time) is a concern, then a low-temperature-deposition $SiO_2$ can be deposited by plasma-enhanced CVD (PECVD) or by high-density plasma CVD (HDP-CVD). The deposition temperature for the low-temperature oxide is typically in the range of between about 300° and 500° C. Layer 14 is then planarized. For example, chemical/mechanical polishing (CMP), as commonly practiced in the industry, can be used to form a globally planar surface. Preferably after planarization the thickness of the ILD layer 14 is between about 5000 and 20000 Angstroms over the patterned first conductive layer 12, but more specifically to a thickness of about 10000 Angstroms.

Still referring to FIG. 6, a hard mask layer 16 is deposited. Layer 16 is composed of a silicon nitride ($Si_3N_4$) and is deposited using PECVD or HDP-CVD using as the reactant gas a mixture of dichlorosilane ($SiCl_2H_2$) and ammonia ($NH_3$). The silicon nitride layer 16 is deposited to a preferred thickness of between about 500 and 3000 Angstroms, but more specifically to a thickness of 2000 Angstroms.

Now as shown in the schematic cross-sectional view of FIG. 7A, conventional photolithographic techniques using a patterned first photoresist mask 18 and a first aniso-tropic plasma etching are used to pattern the hard mask layer 16 and to partially etch into the InterLayer Dielectric (ILD) layer 14 to form trenches 2 in which a patterned second conducting layer is later formed for the next level of metal lines. Typically, for a 0.18 um technology (minimum device feature size), the trenches are etched having a width of between about 0.2 and 0.5 um or more specifically a width of 0.2 um. The trenches 2 are etched to a depth of between about 0.5 and 1.0 um, but more specifically to a depth of 0.5 um in the ILD layer 14. For example, the trenches can be etched using reactive ion etching (RIE) or a HDP etcher and an etchant gas mixture such as trifluoromethane ($CHF_3$), perfluoroisobutylene ($C_4F_8$), and argon (Ar).

Figure 7A:
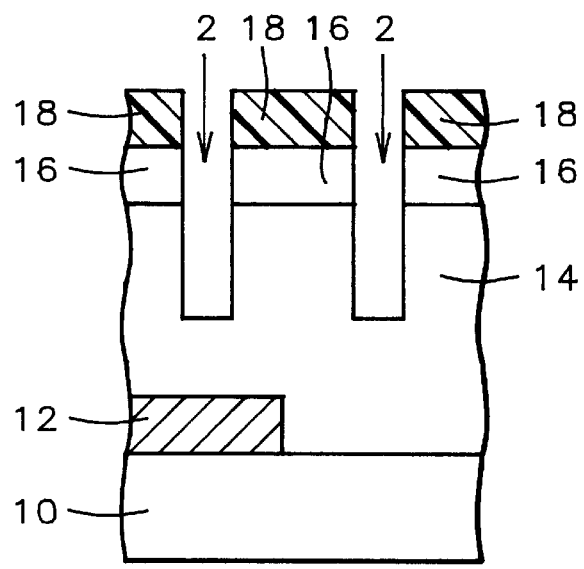
Figure 7B:
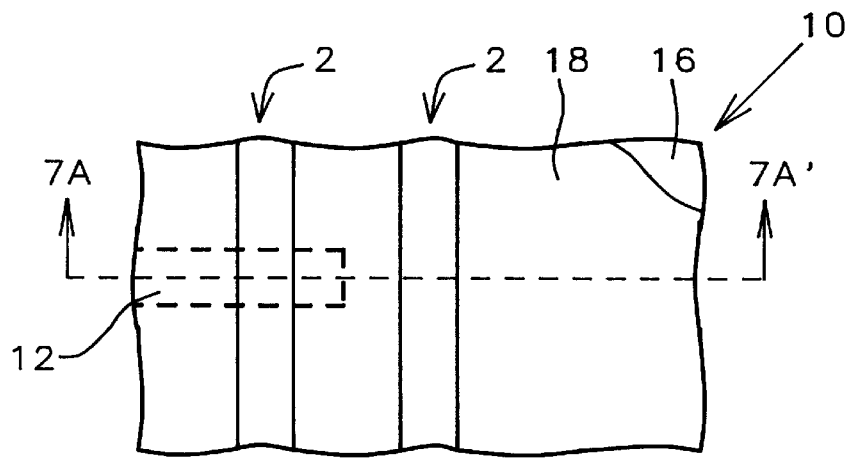

Shown in FIG. 7B is a top view of the patterned photoresist mask 18 having the openings 2 for etching the trenches 2, in which the cross section through the region 7A–7A' is shown in FIG. 7A for the two trenches 2 of the many trenches that are etched in the ILD layer 14 on the substrate 10. The trench 2 on the left in FIGS. 7A and 7B extends over the patterned first conducting layer 12 to which one of the borderless vias, by the method of this invention, will be made. The trench 2 on the right in FIGS. 7A and 7B will have a borderless via made to the substrate surface.

Figure 8A:
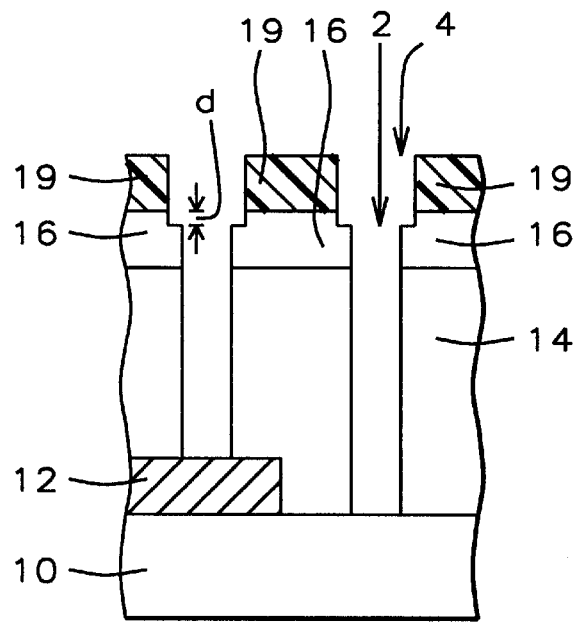
Figure 8B:
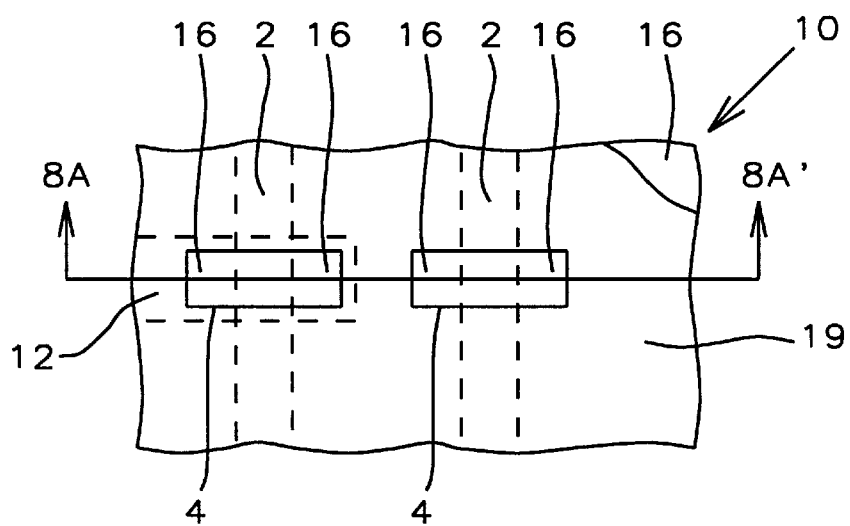

Referring now to FIG. 8A, the first photoresist mask 18 is removed, for example by plasma ashing in oxygen or ozone, and a second photoresist layer 19 is spin coated on the hard mask layer 16. The second photoresist layer 19 is then patterned to form the openings 4 extending over the trench 2, as shown in FIG. 8B, to form vias, also labeled 4. The photoresist mask 19 and the exposed hard mask 16, as shown in FIG. 8A and 8B, serve as an etch-stop while the vias 4 are selectively etched in the trenches 2 to the patterned first conducting layer 12 and to the substrate 10. Preferably the selective etching is achieved by anisotropic etching using an etcher and etchant gas mixture that has an etch rate selectivity (ratio) of greater than 20:1 between the silicon oxide ILD layer 14 and the silicon nitride layer 16. For example, if the ILD layer 14 is 1.0 micrometers (um) thick and the trenches are 0.5 um deep, then the vias can be etched with a 50% overetch to ensure that all vias are etched open. This results in a recess having a depth d that is less than a 25- to 50-nanometer (nm) (0.025–0.050 um) in the $Si_3N_4$ hard mask layer 16, as depicted in FIG. 8A. This shallow depth is a result of the high etch-rate selectivity between the ILD layer 14 and the $Si_3N_4$ layer 16.

The second anisotropic plasma etching of the vias 4 is preferably carried out in a high-density plasma (HDP) etcher, for example a model Alliance—9100, manufactured by Lam Research of U.S.A. can be used. The preferred etchant gas mixture is composed of hydrofluorocarbons $CHF_3$ and $C_2HF_5$.

Continuing with the process, and as shown in FIG. 9, the second photoresist layer (etch mask) 19 is removed, for example, by plasma ashing, and a conformal second conducting layer 20 is deposited, including a barrier layer such as Ti and/or Ti/TiN. Layer 20 is preferably composed of aluminum (Al) or an Al/Cu alloy to improve electromigration, and is deposited to fill the vias 4 and the trenches 2 using current techniques for filling high aspect-ratio openings. For example, directional physical sputter deposition, CVD Al, high pressure Al extrusion, and the like can be used. Alternatively, the method is also applicable to the use of copper (Cu) for layer 20 to further improve the electrical conductivity and to reduce the RC time delays in the 0.18 um technology circuits.

Referring now to FIG. 10, the excess metal 20 is removed by a modified chemical/mechanical polishing in which the second conducting layer 20 is polished back to the ILD layer 14. And important to the method of this invention, an overpolishing is carried out to remove the slight recessed areas R (about 25–50 nm deep) in the $Si_3N_4$ hard mask 16 and any metal residue that lies therein, as depicted in FIG. 9. This results in a borderless (self-aligned) via structure for the metal lines formed from metal layer 20 coplanar with the top surface of the remaining hard mask 16 which is retained in the final structure. This reduces the design rule spacings S, as shown in FIG. 10, thereby increasing the metal line density necessary for ULSI circuits.

Referring now to FIG. 11, the above process can be repeated for forming each additional level of metal interconnections as required to complete the wiring of the integrated circuits. The process for the second level of metallization starts by depositing a second ILD layer 14' composed of a silicon oxide, and a second hard mask layer 16' composed of silicon nitride as an etch stop mask. The thickness of layers 14' and 16' are determined by the circuit requirements. Typically the thickness of layer 14' would be between about 5000 and 20000 Angstroms, and the thickness of layer 16' would be between about 500 and 3000 Angstroms.

The next level (metal 2 level) of trenches 2' is then etched, for example, having an etch depth of between about 0.5 and 1.0 um, followed by etching the next level of vias 4' using the same sequence of process steps used for forming the first metal trenches 2 and the first level vias 4 (contact holes). A second conformal conducting layer 20' (Al, Al-Cu, or Cu) is deposited and chemical/mechanically polished back with an overetch to form the next level of co-planar stacked and borderless via structures.

An important feature of the invention is that the first hard mask layer 16 serves as an excellent etch-stop layer for etching the second level vias 4' because of the high etch-rate ratio of silicon oxide to silicon nitride (greater than 20:1). This results in an essentially coplanar surface across the silicon nitride layer 16/metal layer 20 interface, allowing reliable narrow metal contact plugs 20' to be made to the metal plugs 20 in the first via structure, even when the narrow via structures are misaligned, as depicted by the interface X in FIG. 11. Also shown is the contact between the metal plug 20' for a wider stacked via 4' aligned to the first via 4, as depicted by the interface Y in FIG. 11. Because of the stacked and borderless via structures formed at the second level, the spacings S' can be reduced, improving the design rules over the more conventional via structures having borders.

While the invention has been particularly shown and described with reference to the preferred embodiment thereof, it will be understood by those skilled in the art that various changes in form and details may be made without departing from the spirit and scope of the invention.

What is claimed is:

1. A method for making stacked and borderless via structures for multilevel metal interconnections for integrated circuits on semiconductor substrates comprising the steps of:

a) providing a semiconductor substrate having semiconductor devices formed in and on said substrate and having a patterned first conducting layer formed thereon;

b) depositing an intermetal dielectric layer over said patterned first conducting layer and planarizing said intermetal dielectric layer;

c) depositing a hard mask layer on said intermetal dielectric layer;

d) patterning said hard mask layer and partially etching into said intermetal dielectric layer and forming trenches for a patterned second conducting layer using a first photoresist mask and a first anisotropic plasma etching;

e) forming a second photoresist mask having openings extending over portions of said trenches and using a second anisotropic plasma etch to remove said intermetal dielectric layer remaining in said openings to said patterned first conducting layer while said exposed hard mask serves as an etch stop layer, thereby forming vias in said intermetal dielectric layer self-aligned to and in said trenches;

f) depositing a conformal second conducting layer and filling said vias and said trenches;

g) chemically-mechanically polishing back said second conformal conducting layer to said intermetal dielectric layer and further overpolishing to remove any residue of said second conducting layer remaining in recesses formed in said hard mask layer resulting during said second anisotropic etching, thereby forming borderless via structures and forming a patterned conducting layer in said trenches coplanar with said intermetal dielectric layer;

h) repeating steps b) through g) for each additional level of metal interconnections as required to complete said integrated circuits, and further forming stacked vias, as needed, to reduce said integrated circuit area.

2. The method of claim 1, wherein said first conducting layer is a conductively doped polysilicon layer having a thickness of between about 1000 and 3000 Angstroms.

3. The method of claim 1, wherein said first conducting layer is an aluminum-copper alloy layer having a thickness of between about 4000 and 10000 Angstroms.

4. The method of claim 1, wherein said intermetal dielectric layer is a plasma-enhanced chemical vapor deposited silicon oxide having a thickness after said planarizing of between about 5000 and 20000 Angstroms.

5. The method of claim 1, wherein said intermetal dielectric is planarized by chemical-mechanical polishing.

6. The method of claim 1, wherein said hard mask is silicon nitride having a thickness of between about 500 and 3000 Angstroms.

7. The method of claim 1, wherein said trenches in said intermetal dielectric layer are etched to a depth of between about 0.5 and 1.0 micrometers.

8. The method of claim 1, wherein said second anisotropic plasma etching has an etch-rate ratio of said intermetal dielectric to said hard mask of greater than 20:1.

9. The method of claim 1, wherein said second conducting layer is an aluminum-copper alloy.

10. The method of claim 1, wherein said recesses formed in said hard mask layer are between about 250 and 500 Angstroms deep, and are removed by said overpolishing.

11. A method for making stacked and borderless via structures for multilevel metal interconnections for integrated circuits on semiconductor substrates comprising the steps of:

a) providing a semiconductor substrate having semiconductor devices formed in and on said substrate and having a patterned first conducting layer composed of a conductively doped polysilicon layer formed thereon;

b) depositing an intermetal dielectric layer composed of silicon oxide over said patterned first conducting layer and planarizing said intermetal dielectric layer;

c) depositing a hard mask layer composed of silicon nitride on said intermetal dielectric layer;

d) patterning said hard mask layer and partially etching into said intermetal dielectric layer and forming trenches for a patterned second conducting layer using a first photoresist mask and a first anisotropic plasma etching;

e) forming a second photoresist mask having openings extending over portions of said trenches and using a second anisotropic plasma etch to remove said intermetal dielectric layer remaining in said openings to said patterned first conducting layer while said exposed hard mask serves as an etch stop layer, thereby forming vias in said intermetal dielectric layer self-aligned to and in said trenches;

f) depositing a conformal second conducting layer, composed of a metal layer, and filling said vias and said trenches;

g) chemically-mechanically polishing back said second conducting layer to said intermetal dielectric layer and further overpolishing to remove any residue of said second conducting layer remaining in recesses formed in said hard mask layer resulting during said second anisotropic etching, thereby forming borderless via structures and forming a patterned conducting layer in said trenches coplanar with said intermetal dielectric layer;

h) repeating steps b) through g) for each additional level of metal interconnections as required to complete said integrated circuits, and further forming stacked vias, as needed, to reduce said integrated circuit.

12. The method of claim 11, wherein said conductively doped polysilicon layer has a thickness of between about 1000 and 3000 Angstroms.

13. The method of claim 11, wherein said silicon oxide layer is deposited by plasma-enhanced chemical vapor deposition and has a thickness after said planarizing of between about 5000 and 20000 Angstroms.

14. The method of claim 11, wherein said intermetal dielectric is planarized by chemical-mechanical polishing.

15. The method of claim 11, wherein said silicon nitride layer is deposited by plasma enhanced chemical vapor deposition and said silicon nitride has a thickness of between about 500 and 3000 Angstroms.

16. The method of claim 11, wherein said trenches in said intermetal dielectric layer are etched to a depth of between about 0.5 and 1.0 micrometers.

17. The method of claim 11, wherein said second anisotropic plasma etching has an etch-rate ratio of said intermetal dielectric to said hard mask of greater than 20:1.

18. The method of claim 11, wherein said metal layer is an aluminum-copper alloy layer having a thickness of between about 4000 and 10000 Angstroms.

19. The method of claim 11, wherein said recesses formed in said hard mask layer are between about 250 and 500 Angstroms deep, and are removed by said overpolishing.

* * * * *